(12) United States Patent
Chen et al.

(10) Patent No.: US 9,331,146 B2
(45) Date of Patent: May 3, 2016

(54) SILICON NANOWIRE FORMATION IN REPLACEMENT METAL GATE PROCESS

(71) Applicant: International Business Machines Corporation, Armonk, NY (US)

(72) Inventors: Chia-Yu Chen, Guilderland, NY (US);
Zuoguang Liu, Schenectady, NY (US);
Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/301,587

(22) Filed: Jun. 11, 2014

(65) Prior Publication Data

US 2015/0364543 A1 Dec. 17, 2015

(51) Int. Cl.
| | |
|---|---|
| *H01L 21/336* | (2006.01) |
| *H01L 29/06* | (2006.01) |
| *H01L 29/66* | (2006.01) |
| *H01L 21/3105* | (2006.01) |
| *H01L 21/02* | (2006.01) |
| *H01L 21/3065* | (2006.01) |
| *H01L 21/28* | (2006.01) |
| *H01L 21/306* | (2006.01) |

(Continued)

(52) U.S. Cl.
CPC ...... *H01L 29/0669* (2013.01); *H01L 21/02186* (2013.01); *H01L 21/28079* (2013.01); *H01L 21/3065* (2013.01); *H01L 21/30625* (2013.01); *H01L 21/31056* (2013.01); *H01L 29/0649* (2013.01); *H01L 29/0673* (2013.01); *H01L 29/42364* (2013.01); *H01L 29/42372* (2013.01); *H01L 29/42392* (2013.01); *H01L 29/495* (2013.01); *H01L 29/4966* (2013.01); *H01L 29/517* (2013.01); *H01L 29/66795* (2013.01); *H01L 29/785* (2013.01); *H01L 29/7851* (2013.01)

(58) Field of Classification Search
CPC .............. H01L 21/02603; H01L 29/0665; H01L 29/0669
USPC ........................................................ 438/253
See application file for complete search history.

(56) References Cited

U.S. PATENT DOCUMENTS 7,105,390 B2 * 9/2006 Brask .............. H01L 21/823821
257/E21.444
7,452,778 B2 11/2008 Chen et al.
(Continued)

OTHER PUBLICATIONS

S. Shin, et al., "Si-Based Ultrasmall Multiswitching Single-Electron Transistor Operating at Room-Temperature," Applied Physics Letters, vol. 97, 2010, 3 pages.

(Continued)

*Primary Examiner* — Reema Patel
*Assistant Examiner* — Syed Gheyas
(74) *Attorney, Agent, or Firm* — Cantor Colburn LLP; Vazken Alexanian

(57) ABSTRACT

Techniques for a semiconductor device are provided. Techniques are directed to forming a semiconductor device by: forming a fin structure in a substrate, forming a protective layer over an upper portion of the fin structure, the protective layer having an etch selectivity with respect to a material of the fin structure, and performing an undercut etch so as to remove a lower portion of the fin structure below the protective layer, thereby defining a nanowire structure from the fin structure.

12 Claims, 13 Drawing Sheets

(51) Int. Cl.
*H01L 29/78* (2006.01)
*H01L 29/49* (2006.01)
*H01L 29/423* (2006.01)
*H01L 29/51* (2006.01)

(56) References Cited

U.S. PATENT DOCUMENTS

| | | | |
|---|---|---|---|
| 7,601,641 | B1 | 10/2009 | Geiss et al. |
| 7,749,905 | B2 | 7/2010 | Cohen et al. |
| 7,858,481 | B2 | 12/2010 | Brask et al. |
| 8,080,456 | B2 | 12/2011 | Barwicz et al. |
| 8,097,515 | B2 | 1/2012 | Bangsaruntip et al. |
| 8,653,599 | B1 | 2/2014 | Cheng et al. |
| 2005/0112817 | A1* | 5/2005 | Cheng ............. H01L 21/823807 438/219 |
| 2009/0242980 | A1* | 10/2009 | Inoue ................ H01L 27/10876 257/334 |
| 2011/0018065 | A1 | 1/2011 | Curatola et al. |
| 2011/0147697 | A1* | 6/2011 | Shah ....................... B82Y 10/00 257/9 |
| 2012/0038056 | A1* | 2/2012 | Cabral, Jr. ......... H01L 21/31116 257/774 |
| 2012/0256242 | A1 | 10/2012 | Chang et al. |
| 2014/0061582 | A1* | 3/2014 | Cheng ............... H01L 29/78696 257/9 |

OTHER PUBLICATIONS

F. Yang, et al., "5nm-Gate Nanowire FinFET," 2004 Symposium on VLSI Technology, 2004 pp. 196-197.

Chia-Yu Chen, et al., "Silicon Nanowire Formation in Replacement Metal Gate Process," U.S. Appl. No. 14/805,669, filed Jul. 22, 2015.

List of IBM Patents or Patent Applications Treated as Related, YOR920130623US1, Date Filed: Jun. 11, 2014, pp. 1-2.

* cited by examiner

US 9,331,146 B2

SILICON NANOWIRE FORMATION IN REPLACEMENT METAL GATE PROCESS

FIELD OF INVENTION

The present invention relates generally to semiconductor manufacturing techniques, and more specifically, to silicon nanowire formation in replacement metal gate (RMG) processing.

DESCRIPTION OF RELATED ART

A nanowire is a nanostructure, with the diameter of the order of a nanometer ($10^{-9}$ meters). Alternatively, nanowires can be defined as structures that have a thickness or diameter constrained to tens of nanometers or less and an unconstrained length. At these scales, quantum mechanical effects are important, which coined the term "quantum wires". Many different types of nanowires exist, including metallic (e.g., Ni, Pt, Au), semiconducting (e.g., Si, InP, GaN, etc.), and insulating (e.g., $SiO_2$, $TiO_2$). The nanowires could be used, in the near future, to link tiny components into extremely small circuits. Using nanotechnology, such components could be created out of chemical compounds.

Silicon (Si) nanowires serve as a promising candidate for current and future generations of transistors. For example, due to fast switching times and high current densities, fin field effect transistors (FinFETs) are a preferred device in some instances. In a basic form, a FinFET device 10 includes a source, a drain, and one or more fin-shaped channels between the source and drain as shown in FIG. 1. A gate electrode over the fin(s) regulates electron flow between the source and drain.

Conventional transistor/nanowire fabrication techniques are deficient for a number of reasons. For example, conventional techniques are: (1) only suitable for silicon-on-insulator (SOI) substrates, and (2) incompatible with fin formation in a RMG process flow.

BRIEF SUMMARY

Embodiments are directed to a method of forming a semiconductor device, the method comprising: forming a fin structure in a substrate, forming a protective layer over an upper portion of the fin structure, the protective layer having an etch selectivity with respect to a material of the fin structure, and defining a nanowire structure from the fin structure by performing an undercut etch so as to remove a lower portion of the fin structure below the protective layer.

Embodiments are directed to a method for fabricating a nanowire comprising: depositing a protective layer on a fin structure, etching at least a portion of the protective layer proximate to an optical planarization layer of the structure, removing the optical planarization layer from the structure, and providing an undercut etch to remove at least a portion of one or more fins of the structure.

Embodiments are directed to a semiconductor device, comprising: a substrate, and a fin structure formed in the substrate subjected to an undercut etch that removes at least a portion of one or more fins following a partial removal of a protective layer and a removal of an optical planarization layer.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages are apparent from the following detailed description taken in conjunction with the accompanying drawings in which:

DETAILED DESCRIPTION

Figure 1:
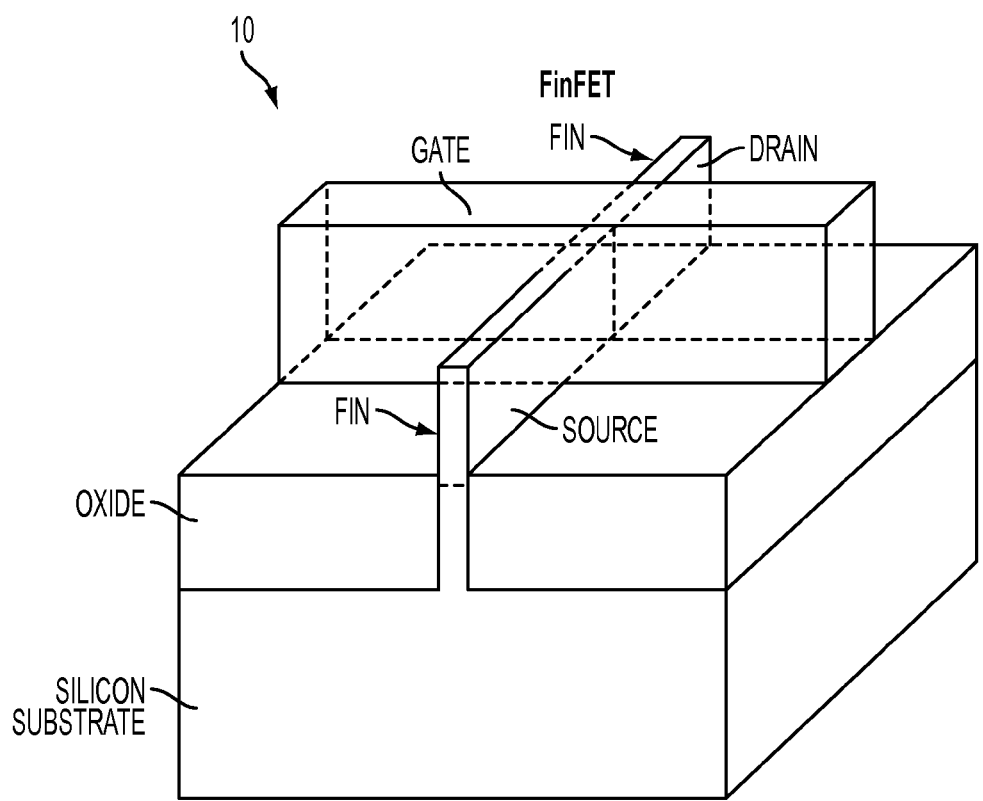
FIG. 1 is an example of a FinFET device.

It is noted that various connections are set forth between elements in the following description and in the drawings (the contents of which are included herein by way of reference). It is noted that these connections in general and, unless specified otherwise, may be direct or indirect and that this specification is not intended to be limiting in this respect. In this regard, a coupling of entities may refer to either a direct or an indirect connection.

Embodiments may be used to provide for a formation of nanowires on both bulk and silicon on insulator (SOI) substrates using the Si fin in the replacement metal gate (RMG) process flow.

Figure 2:
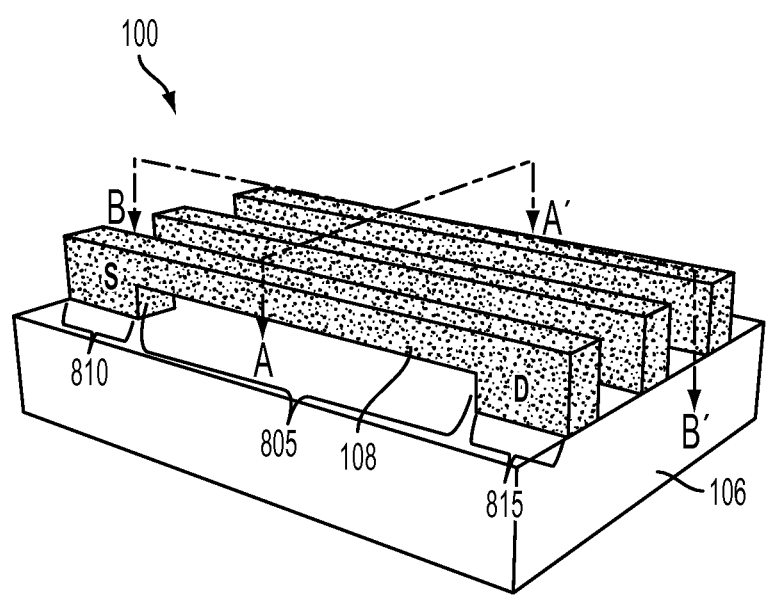
FIG. 2 is a perspective view of a fin structure device in accordance with an embodiment.

FIG. 2 is an example of a perspective view of a fin structure device 100 as a simplified version in accordance with an embodiment. For the sake of clarity, some elements are omitted from FIG. 2 but are discussed below in the process of making a more detailed fin structure 100. The fin structure 100 is primarily discussed from a cross-section taken from line A-A'.

Figure 3:
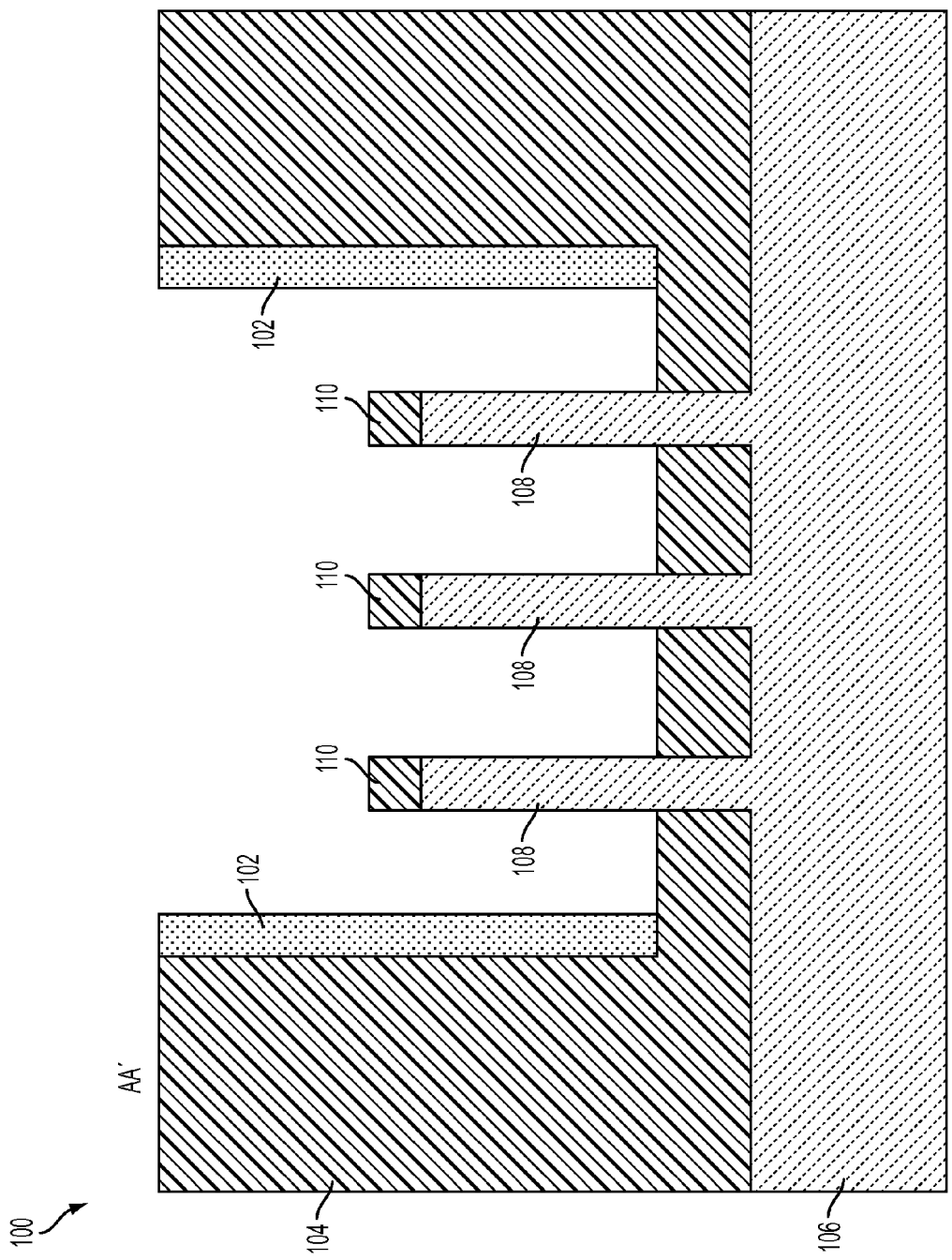
FIG. 3 is a cross-sectional view of a starting point for a structure for fabricating a nanowire in accordance with one or more embodiments.

Turning to FIG. 3, an exemplary embodiment of a starting fin structure 100 is shown. FIG. 3 is a cross-sectional view from line A-A'. In particular, the fin structure 100 includes a substrate 106, such as silicon (or silicon germanium), from which a plurality of fins 108 are formed using a hardmask layer 110, followed by patterning and etching as known in the art. The fin structure 100 may have had silicon of the substrate 106 pulled out or removed as would be known to one of skill in the art. The fins 108 are made by double patterning (common knowledge in semiconductor industry) followed by dry etch (such as $CF_4$ reactive ion etching), as understood by one skilled in the art. In one case, etching may be used to remove the parts of the substrate 106 not protected under the hardmask 110 to result in the fins 108. For explanation purposes, only three fins 108 are shown and it is contemplated that more or fewer fins 108 may be used.

As further illustrated in FIG. 3, an insulating layer 104, such as a silicon dioxide ($SiO_2$) material, is formed over the substrate 106 and serves as a dielectric or insulator for the structure 100. A spacer structure 102 comprising a silicoboron carbonitride (SiBCN) and/or silicon oxycarbon nitride (SiOCN) material is formed on sidewalls of an opening in the insulating layer 104, which opening exposes the fins 108. The spacer structure 102 may be used to facilitate removal of a deposition of titanium nitride (TiN) material described in greater detail further below.

As seen in the cross-sectional view from line A-A', the thickness/width of deposited space structure 102 may range from 7-10 nanometers (nm), and the width of the hardmask may be about 10 nm, which results in the width of the fins 108 ranging from 7-10 nanometers.

Figure 4:
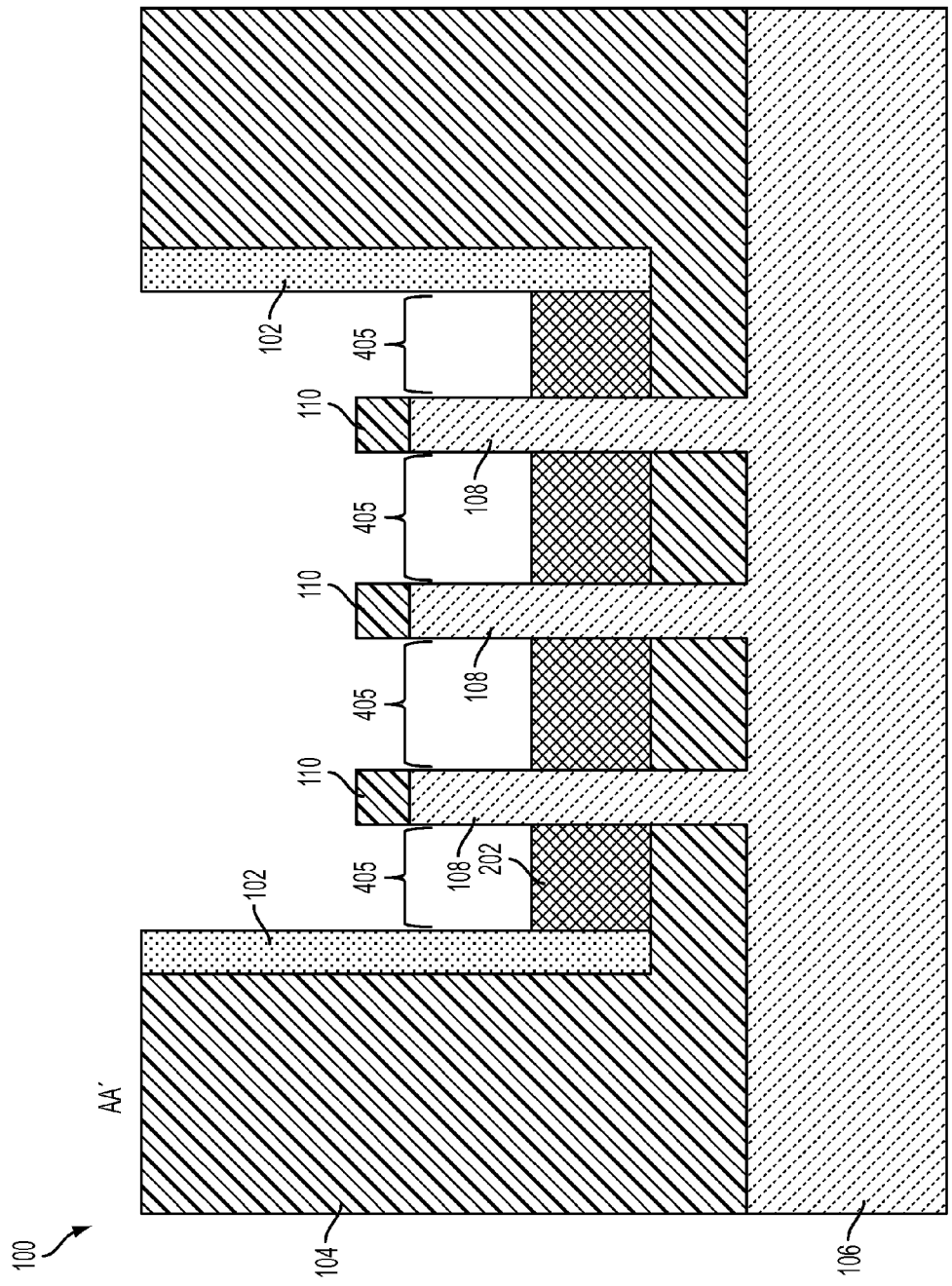
FIG. 4 is a cross-sectional view of the structure of FIG. 3 with an optical planarization layer in accordance with one or more embodiments.

Turning to FIG. 4, the fin structure 100 has openings 405. A sacrificial optical planarization layer (OPL) 202 is deposited within the opening 405 in the insulating layer 104. The OPL 202 may be made of one or more materials, such as an organic oxide, and is formed over the device by a suitable process, such as spin coating, for example, followed by recessing. The thickness/height of the OPL 202 may be about 20 nanometers (nm), and the thickness/height is used to determine the height of a fabricated nanowire (fin 108). To obtain a smaller nanowire, the deposition thickness/height of the OPL can be greater than 20 nm. The OPL 202 may be used to support etching as described further below, and corresponds to a location where fin removal is to occur.

Figure 5:
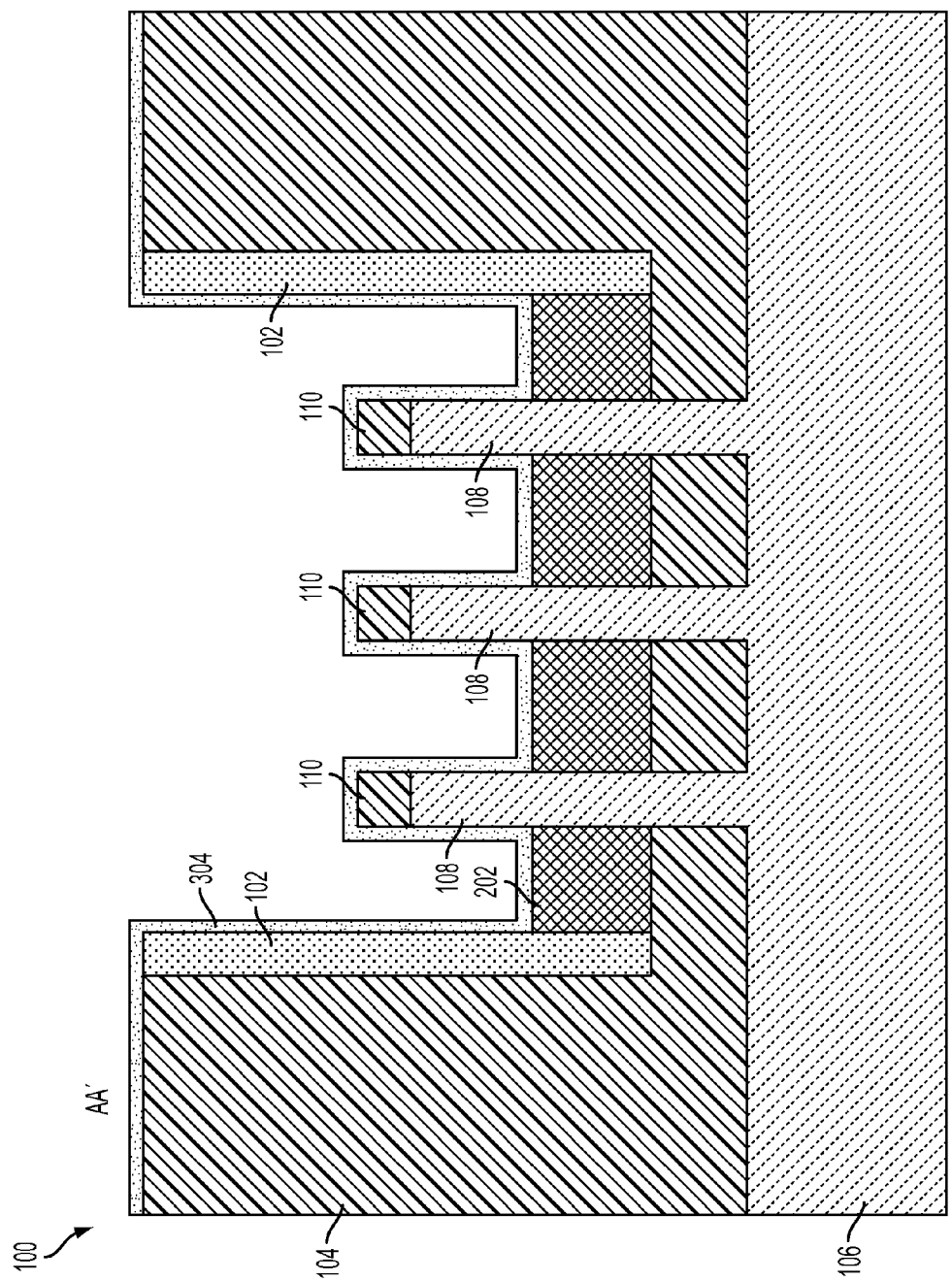
FIG. 5 is a cross-sectional view of the structure of FIG. 4 with titanium nitride (TiN) in accordance with one or more embodiments.

FIG. 5 illustrates the fin structure 100 following deposition of a protective titanium nitride (TiN) layer 304 over the insulating layer 104, the spacer structure 102, OPL 202, fins 108 and hardmask 110. The TiN layer 304 may serve to protect the part of the fin(s) 108 that are to be subsequently converted to nanowire structures.

Figure 6:
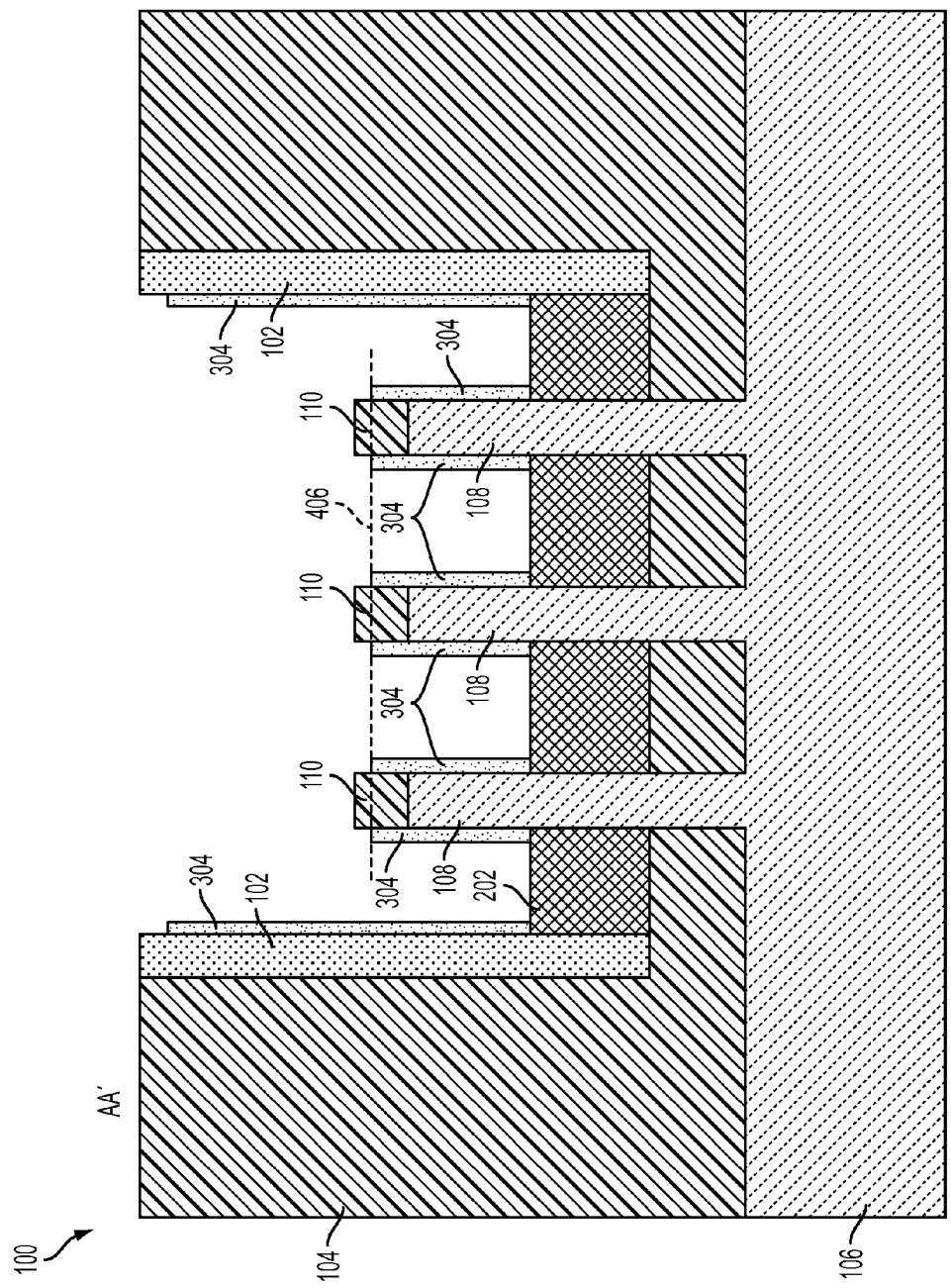
FIG. 6 is a cross-sectional view of the structure of FIG. 5 following performance of reactive ion etching (RIE) on the protective layer (TiN) in a vertical manner or fashion in accordance with one or more embodiments.

Turning to FIG. 6, the structure is 100 is shown following performance of directional and/or anisotropic reactive ion etching (RIE) on the TiN 304 in a vertical manner or fashion. As shown in FIG. 6 (relative to FIG. 5), horizontal portions of the TiN 304 on top of and/or proximate to the layer 202 are removed following the performance of the RIE. The protective layer 304 is removed over the OPL 202 in order to expose the OPL 202. As shown via the dashed line 406, the RIE may be tuned to keep the top of the remaining vertical portions of the TiN layer 304 that remains on the fin 108 sidewalls extending over the fin 108 height and that remains within the hardmask 110 region. An exemplary embodiment is shown in FIG. 4, wherein a loss of TiN protective material 304 on the hardmasks 110 is shown above the dashed line 406. One example of a suitable etch chemistry for selective removal of TiN with respect to $SiO_2$ or SiN in this regard is boron trichloride ($BCl_3$).

Figure 7:
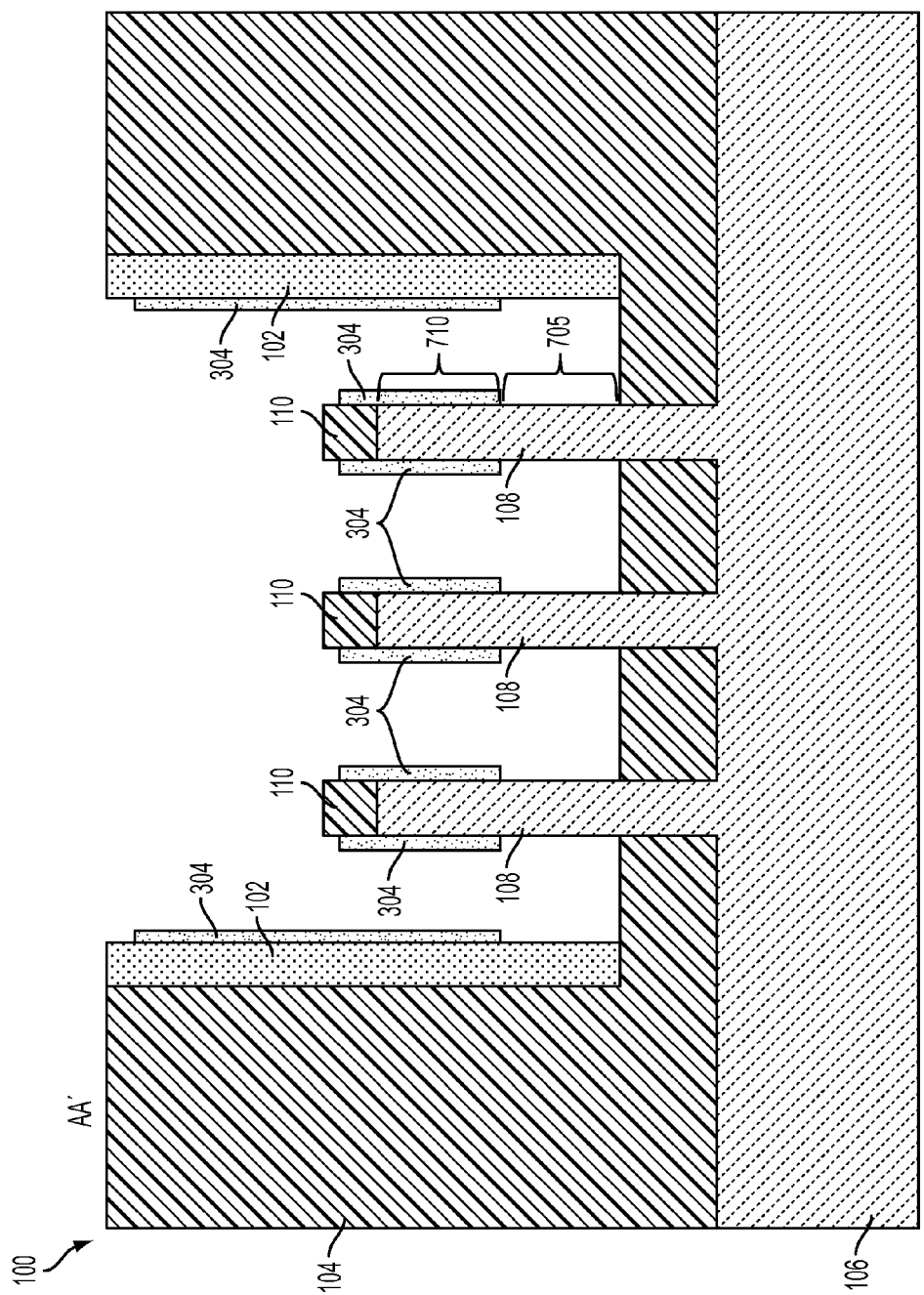
FIG. 7 is a cross-sectional view of the structure of FIG. 6 following removal of the optical planarization layer in accordance with one or more embodiments.

Turning to FIG. 7, the structure is 100 is shown following removal of the OPL 202. The OPL 202 may be removed using an etchant such as SPM: $H_2SO_4$:$H_2O_2$. After the OPL 202 is removed, the fins 108 each have exposed portions 705 and unexposed portions 710. The unexposed portions 710 of the fins 108 each have the protective layers 304 on the sidewalls and the hardmask 110 on the top. The unexposed portions 710 of the fins 108 are going to be the nanowire after further etching.

Figure 8:
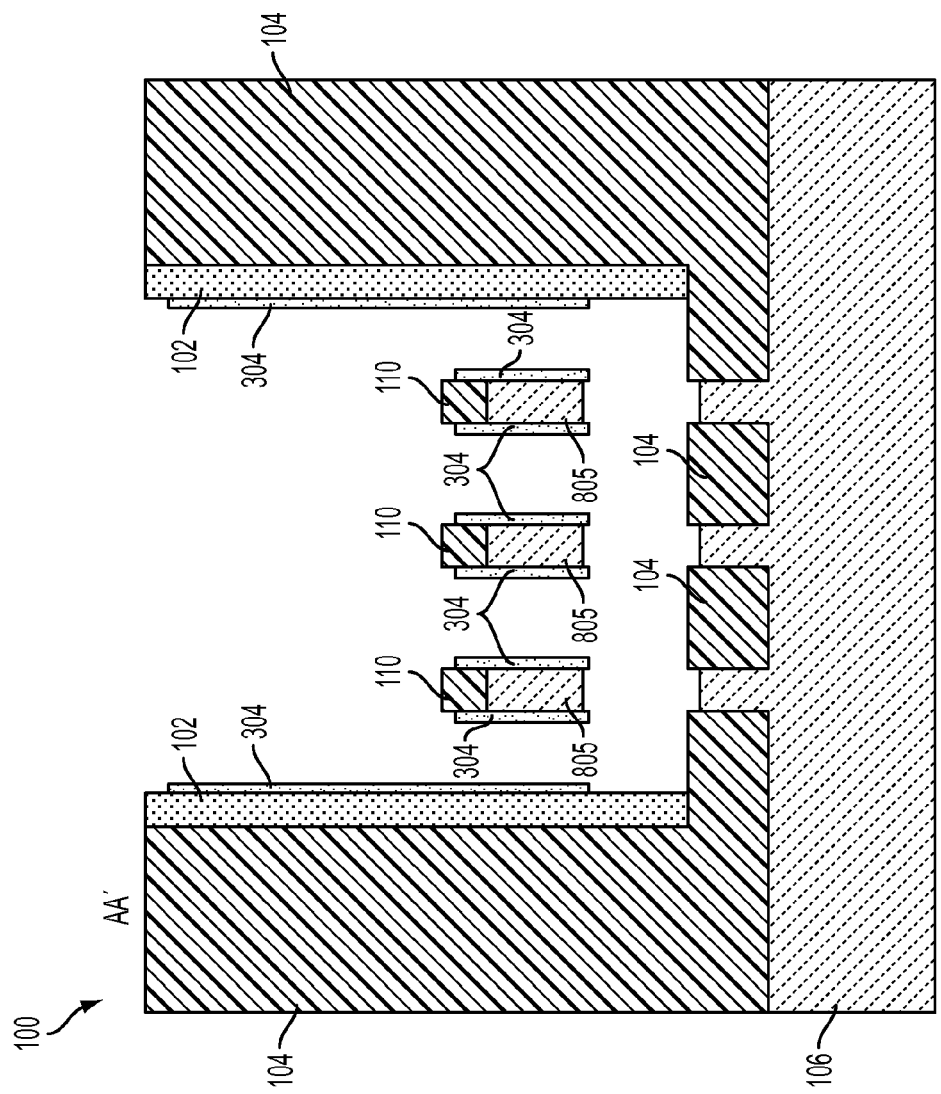
FIG. 8 is a cross-sectional view of the structure of FIG. 7 following etching in accordance with one or more embodiments.

FIG. 8 illustrates the fin structure 100 following etching (e.g., wet etching) so as to remove exposed portions 705 of the fins 108 approximately corresponding to the thickness/location of the removed OPL 202. In other words, the exposed portion 705 silicon are etched away. As a result, a plurality of nanowires 805 is formed from the unexposed portions 710 of the fins 108. Referring to FIG. 2, each of the fins 108 has a nanowire 805 that connects the source 810 and drain 815 according to embodiments. Note that state-of-the-art techniques for forming silicon nanowires do not remove the silicon itself but would instead remove the silicon dioxide under the nanowire. Also, state-of-the-art nanowire fabrication does not form the fin structure 100 with fins 108 having nanowires 805 extending from the source to the drain.

Figure 9:
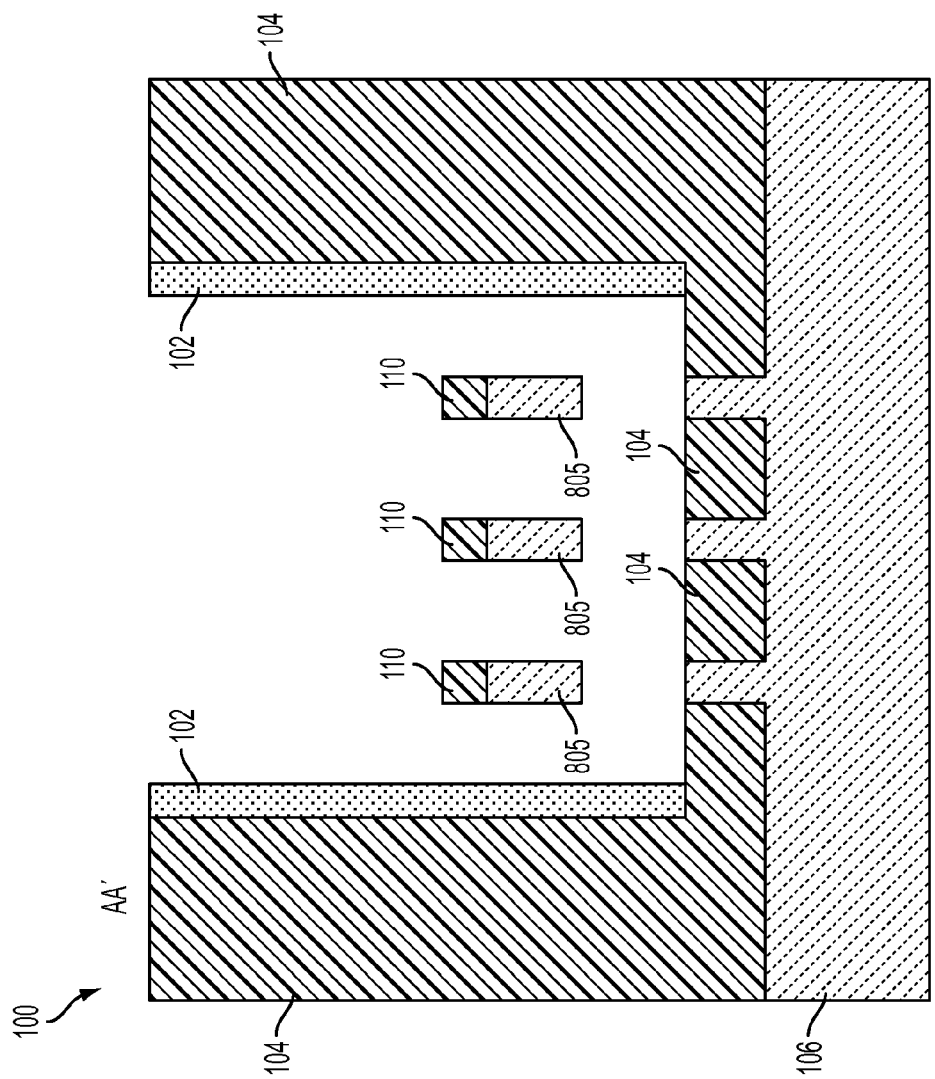
FIG. 9 is a cross-sectional view of the structure of FIG. 8 following removal of any remaining protective layer (TiN) in accordance with one or more embodiments.

Continuing the fabrication process, FIG. 9 illustrates the fin structure 100 following removal of the remaining portions of the TiN layer 304. The TiN 304 layer may be removed in order to provide for a "clean" nanowire 805 and to support depositing of a gate dielectric layer. Although the nanowires 805 appear suspended in the air in the cross-sectional view of FIG. 9, the nanowires 805 run in and out of the page, with one end of each nanowire 805 connected to the drain 815 and the other end connected to the source 810, which is shown more clearly in the simplified perspective view of FIG. 2.

Figure 10:
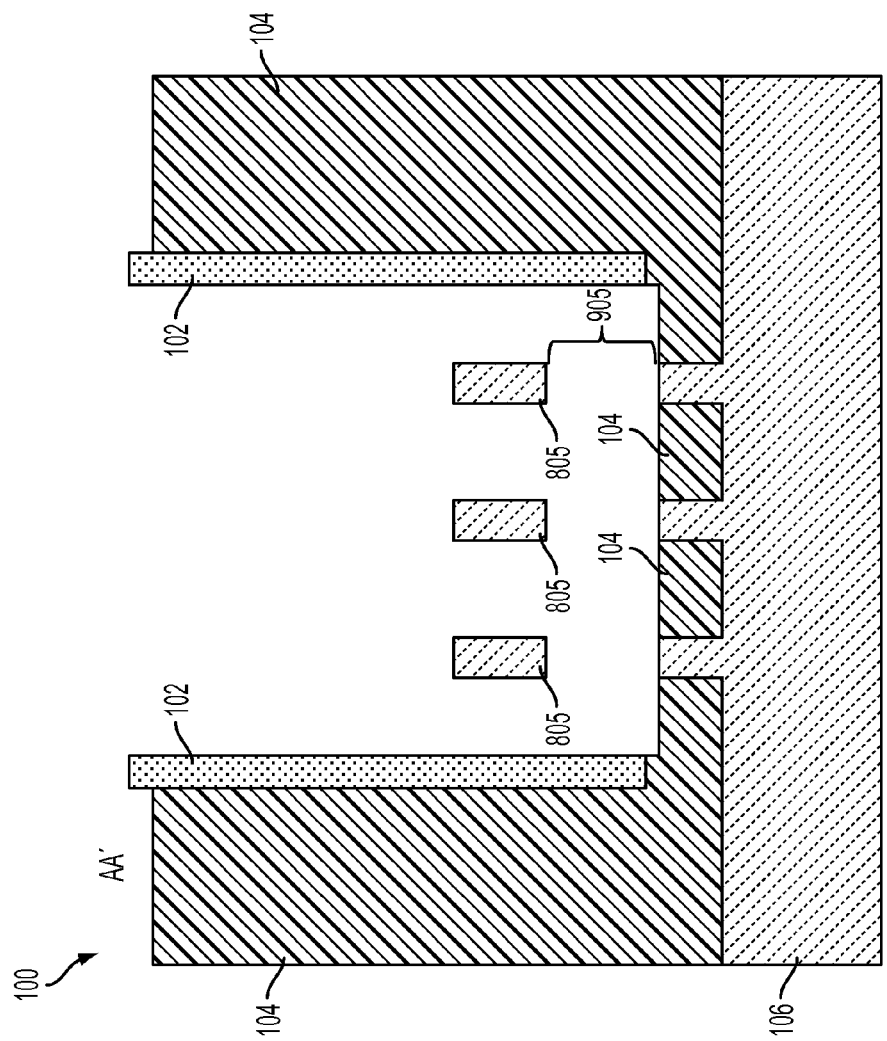
FIG. 10 is a cross-sectional view of the structure of FIG. 9 following removal of hard masks (HMs) in accordance with one or more embodiments.

Turning to FIG. 10, the structure 100 is shown following removal of the hardmask 110. The hardmasks 110 may be removed to facilitate a deposit of oxide on the full nanowire 805. As shown in FIG. 10 (relative to FIG. 9), there may be a loss in insulating layer material 104 (towards the top) as a result of removing the hardmask 110 from the top of the nanowires 805, in the event the hardmask is formed from the same materials as the insulating layer 104. The loss or unevenness associated with the material 104 may be addressed by a chemical mechanical planarization (CMP) process as described further below. FIG. 10 also shows the space/voids 905 that are left after the exposed portions 705 of the fins 108 were removed. The exposed portions 705 corresponded to the height of the OPL 202, which may be about 20 nm. Accordingly, the height of each space/void/undercut underneath the nanowires 805 is about 20 nm.

Figure 11:
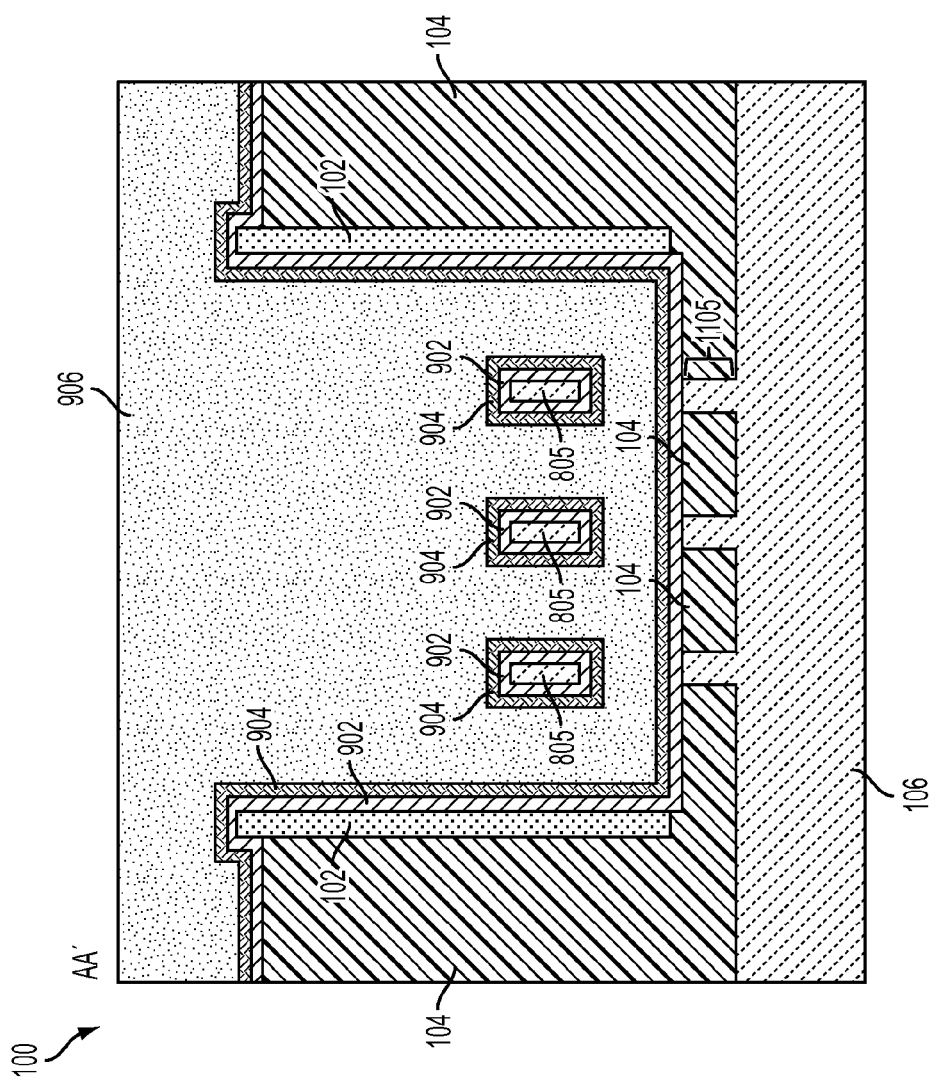
FIG. 11 is a cross-sectional view of the structure of FIG. 10 following application of multiple deposits in accordance with one or more embodiments.

FIG. 11 illustrates the fin structure 100 following further replacement metal gate processing. A high-k material/oxide layer 902 is deposited on top and sides of the layer 102, on top of the layer 104, on the top, sides, and bottom of the nanowires 805, and on top of embedded portions 1105 of the fins 108. The thickness of the high-k material/oxide layer 902 may be few nanometers or less thick, as desired and understood by one skilled in the art. Examples of high-k materials include hafnium silicate, zirconium silicate, hafnium dioxide, zirconium dioxide, and so forth. A work function metal (WFM) (e.g., TiN) layer 904 is deposited over all of the high-k material/oxide layer 902. The thickness of the work function metal layer 904 may be few nanometers or less thick, as desired and understood by one skilled in the art.

Figure 12:
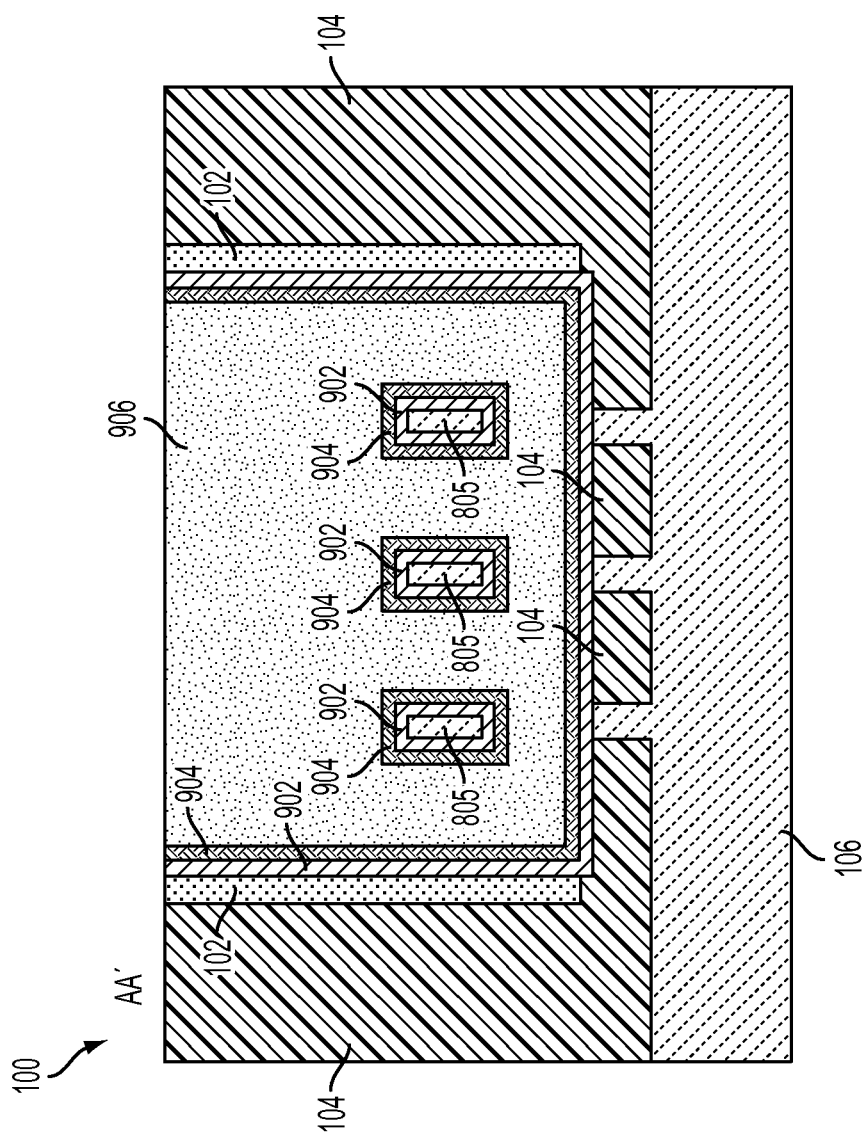
FIG. 12 is a cross sectional view of the structure of FIG. 11 following application of a chemical mechanical planarization (CMP) process in accordance with one or more embodiments.

Further, a tungsten (W) layer 906 may be deposited to cover and fill in the entire fin structure 100. FIG. 12 illustrates the structure 100 after the CMP process referenced above is applied. As shown in FIG. 10, following the CMP process the top of the structure 100 is smooth or flat, which may allow for layers or interconnects in accordance with conventional techniques to be added.

Thus, the structure 100 may be modified and fabricated based on an application of various techniques or operations in accordance with the sequence described above in the progression from FIG. 3 to FIG. 12. Other sequences or operations may be used as part of the fabrication of the device 100. The fin structure 100 shown in FIG. 12 is a more detailed version of the fin structure 100 shown in FIG. 2.

Figure 13:
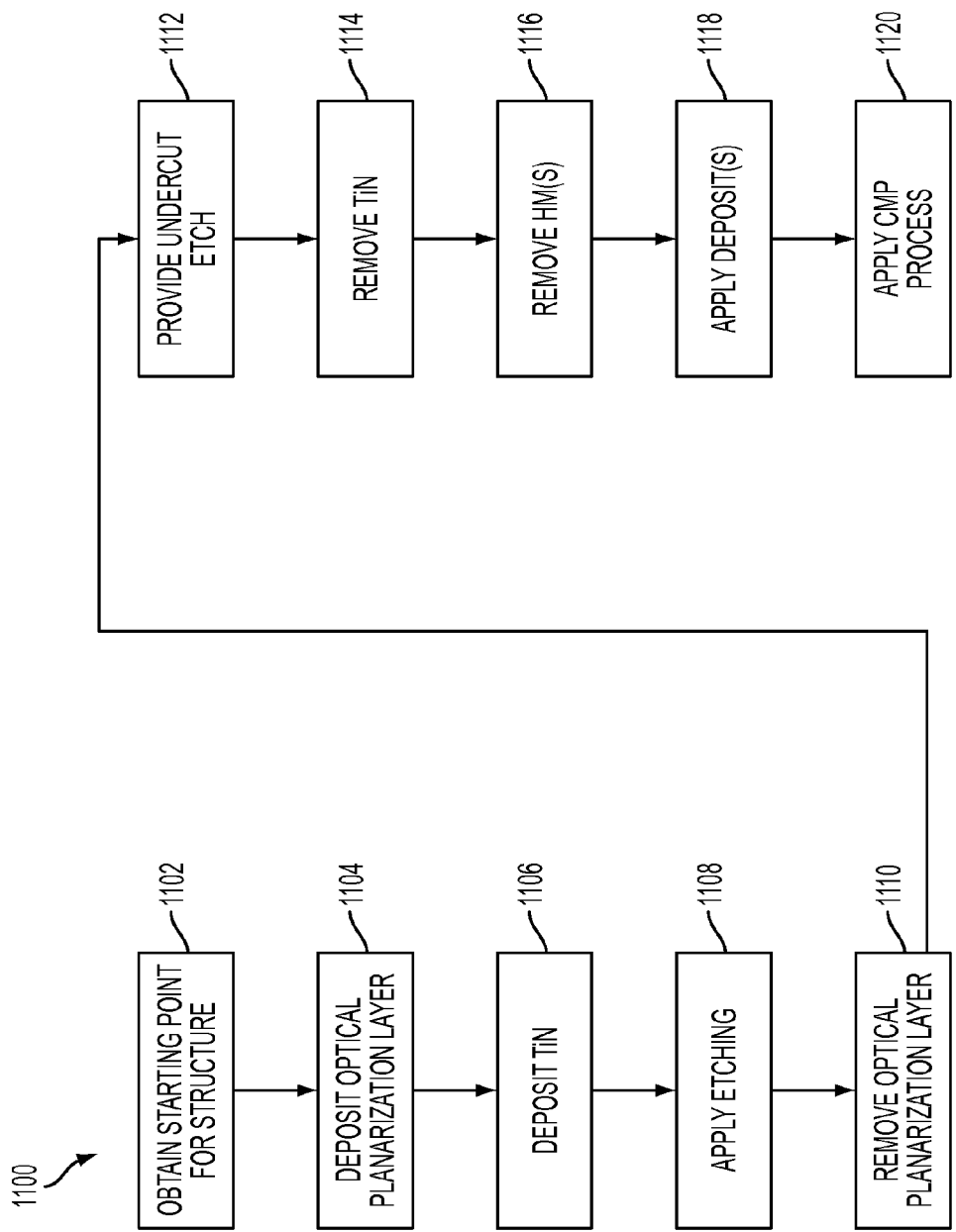
FIG. 13 is a flow chart of an exemplary method in accordance with one or more embodiments.

Turning now to FIG. 13, a flow chart of an exemplary method 1200 in accordance with one or more embodiments is shown. The method 1100 may be used to fabricate a device and/or nanowire. Reference can be made to FIGS. 1-13 discussed above.

In block 1102, a starting point for a structure (e.g., structure 100) may be obtained. For example, the structure 100 as shown in FIG. 3 may correspond to a starting point.

In block 1104, an optical planarization layer (e.g., layer 202) may be deposited on the structure of block 1102. FIG. 4 shows deposition of the OPD layer 202, where the height of the OPD layer 202 has an inverse relationship to the height of the nanowires 805.

In block 1106, a protective layer 304 (e.g., TiN 304) may be deposited on the structure 100 as shown in FIG. 5.

In block 1108, TiN RIE may be applied to remove at least a portion of the protective layer 304 (TiN) applied in block 1106. For example, the RIE may remove a portion of the TIN that is on top of and/or proximate to the optical planarization layer 202.

In block 1110, the optical planarization layer 202 may be removed from the structure 100. This leaves an exposed portion 705 and unexposed portion 710 of each fin 108 as shown in FIG. 7.

In block 1112, an undercut (wet) etch may be provided, which results in a removal of at least a portion of one or more fins associated with the structure. For example, when the undercut wet etch is applied, the exposed portion 705 of the fins 108 (in FIG. 7) are etched away, so as to leave empty space/voids 905 (i.e., an undercut) underneath each fin 108 and to thereby form the nanowires 805. The nanowires 805, seen more clearly in FIG. 2, extend from the source 810 to the drain 815.

In block 1114, any remaining protective (TiN) layer 304 following the application of the RIE in block 1108 may be removed as shown in FIG. 9.

In block 1116, one or more hardmasks 110 (HMs) (in FIG. 9) may be removed from the structure in FIG. 10.

In block 1118, one or more deposits may be applied to the structure 100. For example, the high-k material/oxide layer 902, the work function metal (WFM) (e.g., TiN) layer 904, and the tungsten (W) layer 906 are all deposited on the structure 100 as seen in FIG. 11.

In block 1120, a CMP process may be applied to the structure 100 as shown in FIG. 12.

The method 1100 is illustrative. In some embodiments, one or more of the blocks (or portions thereof) may be optional. In some embodiments, one or more blocks or operations not shown may be included. In some embodiments, the blocks or operations may execute in an order or sequence different from what is shown in FIG. 13.

The illustrative examples described herein included references to various elements, materials, and compounds. One skilled in the art would appreciate that other elements, materials, and compounds may be substituted for those that were specifically referenced herein.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method of forming a semiconductor device, the method comprising:
    forming a fin structure in a substrate;
    forming a protective layer over an upper portion of the fin structure, the protective layer having an etch selectivity with respect to a material of the fin structure, wherein the protective layer is directly on and is the same on both sidewalls of the fin structure; and
    defining a nanowire structure from the fin structure by performing an undercut etch so as to remove a lower portion of the fin structure below the protective layer.

2. The method of claim 1, further comprising:
    forming a sacrificial planarizing layer over the lower portion of the fin structure, such that the sacrificial planarizing layer abuts both of the sidewalls of the fin structure, wherein the material of the fin structure is different from the sacrificial planarizing layer abutting the sidewalls;
    forming the protective layer over the sacrificial planarizing layer and the upper portions of the fin structure;
    removing horizontal portions of the protective layer;

removing the sacrificial planarizing layer so as to expose the lower portion of the fin structure; and performing the undercut etch on the lower portion of the fin structure having been exposed.

3. The method of claim 2, wherein the sacrificial planarizing layer is made of organic oxide and is formed over the device by spin coating followed by recessing.

4. The method of claim 1, wherein the protective layer comprises titanium nitride.

5. A method for fabricating a nanowire comprising:

depositing a protective layer on a fin structure, wherein the protective layer is directly on and is the same on both sidewalls of the fin structure;

etching at least a portion of the protective layer proximate to an optical planarization layer of the structure;

removing the optical planarization layer from the structure; and providing an undercut etch to remove at least a portion of one or more fins of the structure.

6. The method of claim 5, wherein the etching of the at least the portion of the protective layer proximate to the optical planarization layer comprises reactive ion etching (RIE).

7. The method of claim 5, further comprising:
removing the remainder of the protective layer subsequent to the undercut etch.

8. The method of claim 5, further comprising:
removing one or more hard masks (HMs) associated with the one or more fins of the structure.

9. The method of claim 5, further comprising:
applying a high-k deposit, a work function metal (WFM), and a tungsten deposit to the structure.

10. The method of claim 5, further comprising:
applying a chemical mechanical planarization (CMP) process to the structure.

11. The method of claim 5, wherein the protective layer comprises titanium nitride.

12. The method of claim 5, wherein the optical planarization layer is made of organic oxide.

* * * * *